United States Patent [19]

Kim et al.

[11] Patent Number: 5,578,964
[45] Date of Patent: Nov. 26, 1996

[54] CMOS DIFFERENTIAL OPERATIONAL AMPLIFIER

[75] Inventors: Young H. Kim; Dong S. Ha, both of Seoul, Rep. of Korea

[73] Assignee: Korea Telecommunication Authority, Rep. of Korea

[21] Appl. No.: 428,541

[22] Filed: Apr. 24, 1995

[30] Foreign Application Priority Data

Apr. 26, 1994 [KR] Rep. of Korea .................. 1994-8824

[51] Int. Cl.$^6$ ........................................ H03F 3/45
[52] U.S. Cl. ........................................ 330/253; 330/258
[58] Field of Search ..................... 330/252, 253, 330/258, 259, 311

[56] References Cited

U.S. PATENT DOCUMENTS 5,216,380  6/1993  Carbou ........................... 330/258 X Primary Examiner—Steven Mottola
Attorney, Agent, or Firm—Merchant, Gould, Smith, Edell, Welter & Schmidt

[57] ABSTRACT

A CMOS differential operational amplifier has a fully differential structure to improve the output swing and a cascode amplification structure to improve the operating speed. This amplifier includes: a differential input stage 21 which receives differential input voltage signals and converts the input voltage signals into current signals; a cascode output stage 22 which amplifies the current signals from the differential input stage 21 and converts them into high gain output voltage signals; and a common-mode feedback circuit(CMF) 23 which makes a common-mode voltage signal of the output voltage signals equal to a reference voltage signal. To the output ports of the cascode output stage 22, a load capacitor ($C_L$) 24 is connected.

4 Claims, 3 Drawing Sheets

CM OS DIFFERENTIAL OPERATIONAL AMPLIFIER

BACKGROUND OF THE INVENTION

The present invention generally relates to an operational amplifier, and more particularly to a CMOS differential operational amplifier having characteristics of a low operating voltage, a high voltage gain and a high speed.

Recently, due to the rapid development of VLSI technology, a variety of circuits can be integrated into one chip in which digital circuits and analog circuits are mixed. Operational amplifiers are being used widely in communication circuits, switched capacitor filters, A/D and D/A convertors, etc. Particularly, in VLSI circuits, the operational amplifiers are essential elements. Also, the development of semiconductor IC technology brings about a reduction of device size, and thus results in improvement of integration. However, reduction of the device size gives rise to many problems in fabricating semiconductor devices. In particular, it is a serious problem that an internal voltage of the device decreases due to increment of the impurity doping concentration. Therefore, in circuits using such devices having a decreased internal voltage, the power source voltage must be decreased. The decrement of the power source voltage induces decreasing of the voltage gain and the output swing of the operational amplifier.

SUMMARY OF THE INVENTION

Therefore, it is one object of the invention to provide a CMOS differential operational amplifier having a low operating voltage, a high voltage gain and a high speed.

According to the present invention, it is provided a CMOS differential operational amplifier comprising a differential input stage for receiving differential input voltage signals and converting the input voltage signals into current signals; a cascode output stage connected to the differential input stage for amplifying current signals from the differential input stage and converting them into output voltage signals, and having positive and negative output ports; a common-mode feedback circuit, connected to the cascode output stage, for making a common-mode voltage signal of the output voltage signals equal to a reference voltage signal; and a load capacitor connected to the positive and negative output ports.

BRIEF DESCRIPTION OF THE DRAWINGS

The present invention will be described in more detail with reference to the drawings in which.

DESCRIPTION OF THE PREFERRED EMBODIMENTS

Figure 1:
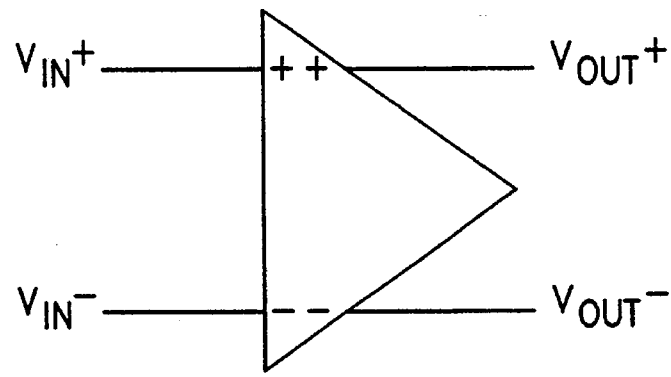
FIG. 1 is a symbolic diagram of a fully differential operational amplifier according to the invention.
Figure 2:
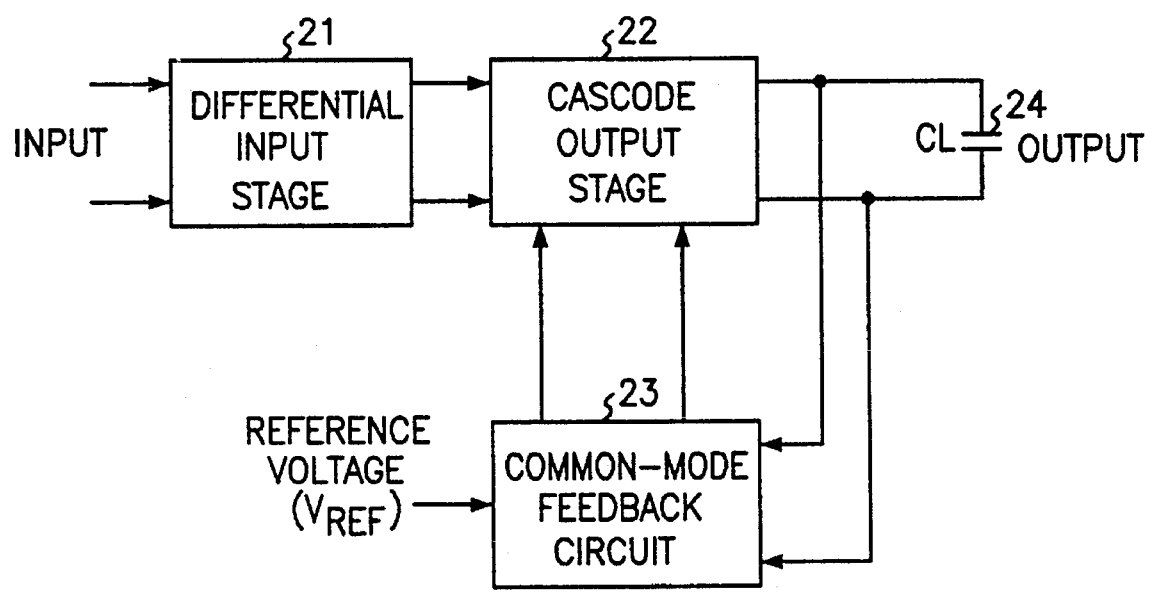
FIG. 2 is a schematic block diagram of the fully differential operational amplifier.
Figure 3:
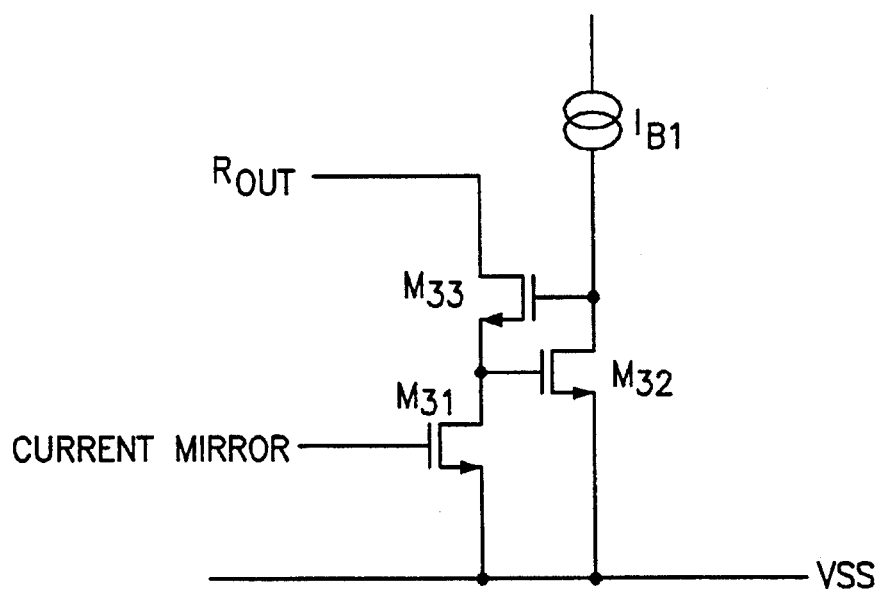
FIG. 3 shows a regulated current source circuit according to the invention.

As can be seen from FIG. 1 which shows a symbolic diagram of a fully differential operational amplifier according to the invention, the fully differential operational amplifier has two(2) differential input ports $V_{IN}^+$ and $V_{IN}^-$ and two(2) differential output ports $V_{OUT}^+$ and $V_{OUT}^-$. Referring to FIG. 2 which shows a schematic block diagram of the fully differential operational amplifier of FIG. 1, the amplifier includes a differential input stage 21 which receives differential input voltage signals and converts the input voltage signals into current signals, a cascode output stage 22 which amplifies the current signals from the differential input stage 21 and converts them into high gain output voltage signals, and a common-mode feedback circuit(CMF) 23 which makes a common-mode voltage signal of the output voltage signals equal to a reference voltage signal. To the output ports of the cascode output stage 22, a load capacitor ($C_L$) 24 is connected. The constitution of the differential input stage 21 is identical to that of a conventional differential operational amplifier and, as apparent from FIG. 5, includes one current source and two transistors. The cascode output stage 22 is implemented by means of four(4) regulated current source circuits as shown in FIG. 3. The regulated current source circuit includes a transistor M31 having a gate connected to a current mirror and a source connected a negative power voltage source $V_{SS}$, a transistor M32 having a gate connected to a drain of transistor M31 and a source connected to the negative power voltage source $V_{SS}$, a transistor M33 having a gate connected to a drain of transistor M32 and a source connected to the drain of transistor M31, and a DC bias current source $I_{B1}$ for driving transistor M32. In this source circuit, transistor M31 functions as a current source and transistor M32 amplifies a voltage applied to the drain of transistor M31. The amplified voltage is then applied to the gate of transistor M33. Accordingly, transistor M31 and transistor M33 operate together as a negative feedback circuit. A current flowing through transistor M31 is equal to a current flowing through transistor M33, namely an output current. An output resistance $r_{out}$ of this source circuit is as follows:

$$r_{out} = g_{m32}\, g_{m33}\, r_{31}\, r_{32}\, r_{33} \qquad (1)$$
$$= A_{v32}\, A_{v33}\, r_{31}$$

where $r_{31}$, $r_{32}$, and $r_{33}$ are respective output resistances of transistors M31, M32 and M33 respectively, $g_{m32}$ and $g_{m33}$ are respective transfer conductances of the transistors M32 and M33 respectively, and $A_{v32}$ and $A_{v33}$ are respective voltage gains of transistors M32 and M33, namely $g_{m32}\, r_{32}$ and $g_{m33}\, r_{33}$, respectively.

As can be seen from expression (1) above, the output resistance $r_{out}$ of this source circuit is dependent on the product of the voltage gain $A_{v32}$ times the voltage gain $A_{v33}$. Accordingly, this source circuit has a very high output resistance and thus functions as a good current source.

Figure 4:
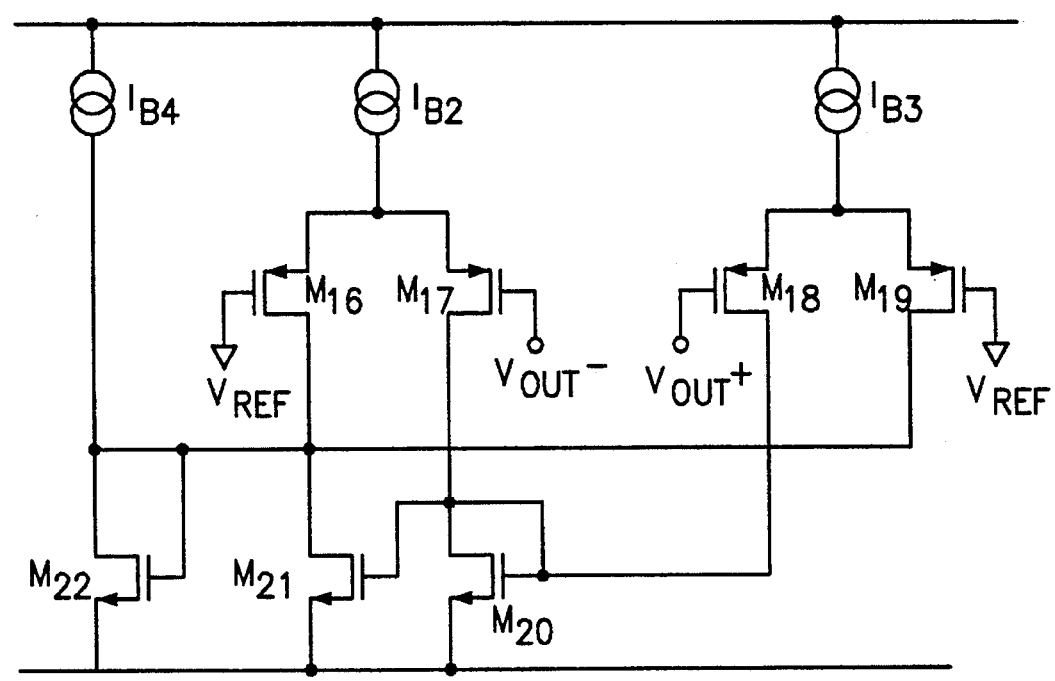
FIG. 4 shows a common-mode feedback circuit according to the invention.

The operational amplifier according to the invention has a fully differential structure to improve the output swing and thus has double the output voltage range than a single ended amplifier. To implement such a fully differential operational amplifier, a common-mode feedback circuit is required to stabilize a common-mode voltage of the output stage. In FIG. 4, a common-mode feedback circuit according to the invention is shown. This CMF circuit includes a transistor M16 having a gate connected to a reference voltage source $V_{REF}$ and a drain connected to a current source $I_{B2}$; a transistor M17 having a gate connected to a negative output port $V_{OUT}^-$ and a drain connected to the current source $I_{B2}$; a transistor M19 having a gate connected to a reference voltage source $V_{REF}$ and a drain connected to a current source $I_{B3}$; a transistor M18 having a gate connected to the positive output port $V_{OUT}^+$ and a drain connected to the current source $I_{B3}$; a transistor M20 having a gate connected to a source of transistor M18, a drain connected to a source of transistor M18 and a source connected to a negative power voltage source $V_{SS}$, and in which its gate and its drain are connected to each other; a transistor M21 having a gate connected to the drain of transistor M20, a drain connected to a connection node connecting the source of transistor M16 with the source of transistor M19 and a source connected to the negative power voltage source $V_{SS}$; and a transistor M22 having a gate connected to the connection node and a drain connected to a current source $I_{B4}$. Transistors M16 and M17 and transistors M18 and M19 constitute a differential pair, respectively. To the respective gates of the transistors M16 and M19, the reference voltage, i.e. 0 V, is applied and to the respective gates of transistors M17 and M18, the output voltages of the amplifier are applied. The input-output transfer characteristics of these two differential pairs are equal to each other. Therefore, when the differential voltage applied to the gate of transistor M17 rises to the positive, the current flowing through transistor M16 increases and the current flowing through transistor M17 decreases. Then, because the output currents of the two differential pairs become equal to each other due to the operation of transistors M20 and M21, the sum of the current flowing through transistor M16 and the current flowing through transistor M19 is identical to the sum of the current flowing through transistor M17 and the current flowing through transistor M18. Accordingly, when the current flowing through transistor M17 decreases, the current flowing through transistor M18 must be increased, and thus the voltage applied to the gate of transistor M18 must be decreased. The amount of the decreased voltage should be equal to the amount of the increased voltage of the gate of transistor M17. Therefore, this common-mode feedback circuit outputs only differential output signals.

In the case where the output voltages $V_{OUT}^+$ and $V_{OUT}^-$ rise concurrently, the current flowing through transistor M17 and the current flowing through transistor M18 decrease, and the current flowing through transistor M16 and the current flowing through transistor M19 increase. Then the output voltages $V_{OUT}^+$, and $V_{OUT}^-$ must be decreased and thus, increasing of the common-mode voltage can be prevented. Due to such negative feedback operation, the common-mode voltage would be equal to the reference voltage, i.e. 0 V.

Figure 5:
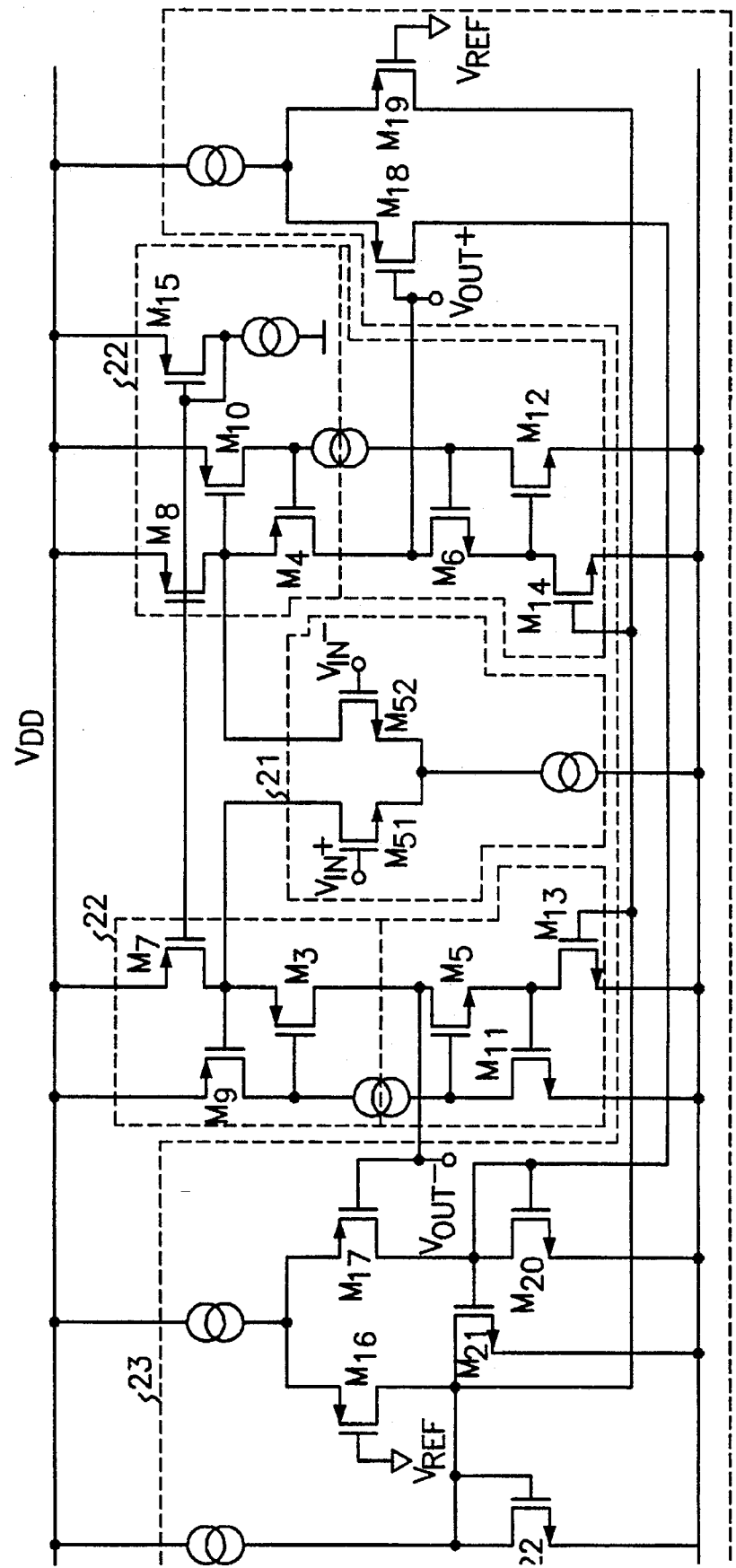
FIG. 5 is a circuit diagram of a fully differential operational amplifier according to the invention.

Referring now to FIG. 5 which shows a circuit diagram of a fully differential operational amplifier according to the invention, transistors M51 and M52 constitute a differential pair for receiving the differential input voltage signals. This differential pair converts the differential input voltage signals into current signals and provides them to the cascode output stage 22. The cascode output stage 22 comprises four(4) regulated current sources which include transistors M3, M7 and M9, transistors M4, M8 and M10, transistors M5, M11 and M13, and transistors M6, M12 and M14, respectively. Transistors M16, M17, M18 and M19 together constitute the common-mode feedback circuit. $V_{DD}$ is a positive power voltage source and $V_{SS}$ is a negative power voltage source. As described above, because the operational amplifier according to the present invention has one stage amplifier structure, its voltage gain is largely dependent on the output resistance and the transconductance of the differential input stage 21. Also the AC characteristic, i.e. frequency characteristic, of the amplifier is dependent on the output resistance and the capacitance of the capacitor connected to the output stage. In the amplifier shown in FIG. 5, a small signal voltage gain Av is expressed as follows:

$$Av = g_{m1} r_{out} \quad (2)$$
$$= g_{m1} [\{r_{08} g_{m10} r_{010} g_{m4} r_{04}\}\|\{r_{014} g_{m12} r_{012} g_{m6} r_{06}\}]$$

As can be seen from expression (2), the small voltage gain is dependent on the product of the input transfer conductance times the output resistance. Therefore, total voltage gain of the amplifier is dependent on the product of three(3) small voltage gains. Such increment of voltage gain is caused by the increment of the output resistance and results in many advantages in devices using a low power supply voltage, particularly in the CMOS operational amplifier. As discussed above, if the power source voltage decreases, the bias voltage between the drain and the source of the transistor in the conventional CMOS operational amplifier decreases and the output resistance in the saturation region of the transistor also decreases. Such decrement of the output resistance results in the decrement of the voltage gain in the amplifier. Accordingly, to improve the voltage gain, it is necessary to increase the output resistance. In the CMOS operational amplifier according to the invention, such a problem can be solved by implementing the cascode output stage by means of the regulated current source shown in FIG. 3. In general, the frequency characteristic of the operational amplifier is dependent on a dominant pole. The position $f_P$ of the dominant pole in the operational amplifier according to the invention can be expressed as follows:

$$f_P = \frac{1}{2\pi r_{out} C_L} \quad (3)$$

As can be seen from the expression (3), the position $f_P$ of the dominant pole is dependent on the load capacitance $C_L$ and the output resistance $r_{out}$. Also, from expressions (2) and (3), the unity-gain bandwidth(U.G.B.) representing the operating frequency region of the operational amplifier can be expressed as follows:

$$\begin{aligned} U.G.B. &= A_v f_P \quad (4) \\ &= \frac{g_{m1} \cdot r_{out}}{2\pi r_{out} C_L} \\ &= \frac{g_{m1}}{2\pi C_L} \end{aligned}$$

As can be seen from the expression (4), in order to increase the U.G.B, the load capacitance $C_L$ should be decreased and/or the transfer conductance $g_{m1}$ should be increased. However, because no parasitic pole should be present within the U.G.B. to stabilize the amplifier circuit, it is limited in increasing the U.G.B. Therefore, to increase the operating frequency of the amplifier, it is necessary to elevate the positions of the parasitic poles. Accordingly, the CMOS operational amplifier according to the invention adopted the cascode structure in which generation of parasitic poles due to the Miller effect can be avoided. In the CMOS operational amplifier according to the invention, because the frequency characteristic is largely dependent on the load capacitance, it is advantageous that the amplifier be used as a high speed application circuit in the IC devices.

While the invention has been described in its preferred embodiments, it is to be understood that the words which have been used are words of description rather than limitation and that changes and modifications may be made within the preview of the appended claims without departing from the true scope and spirit of the invention in its broader aspects.

What is claimed is:

1. A CMOS differential operational amplifier comprising:
   a differential input stage for receiving differential input voltage signals and converting the input voltage signals into current signals;

a cascode output stage comprising a regulated current source having a negative feedback loop to increase an output resistance of the regulated current source, the regulated current source connected to said differential input stage for amplifying said current signals from said differential input stage and converting them into output voltage signals and having positive and negative output ports;

a common-mode feedback circuit, connected to said cascode output stage, for making a common-mode voltage signal of the output voltage signals equal to a reference voltage signal; and a load capacitor connected to said positive and negative output ports.

2. A CMOS differential operational amplifier comprising:

a differential input stage for receiving differential input voltage signals and converting the input voltage signals into current signals;

a cascode output stage, connected to said differential input stage, for amplifying said current signals from said differential input stage and converting them into output voltage signals and having positive and negative output ports;

a common-mode feedback circuit, connected to said cascode output stage, for making a common-mode voltage signal of the output voltage signals equal to a reference voltage signal;

a load capacitor connected to said positive and negative output ports;

wherein said cascode output stage includes four regulated current source circuits, each of which includes:

a first transistor having a gate connected to a current mirror and a source connected to a negative power voltage source;

a second transistor having a gate connected to a drain of said first transistor and a source connected to said negative power voltage source;

a third transistor having a gate connected to a drain of said second transistor and a source connected to said drain of said first transistor; and a current source for driving said second transistor.

3. A CMOS differential operational amplifier comprising:

a differential input stage for receiving differential input voltage signals and converting the input voltage signals into current signals;

a cascode output stage, connected to said differential input stage, for amplifying said current signals from said differential input stage and converting them into output voltage signals and having positive and negative output ports;

a common-mode feedback circuit, connected to said cascode output stage, for making a common-mode voltage signal of the output voltage signals equal to a reference voltage signal;

a load capacitor connected to said positive and negative output ports;

wherein said common-mode feedback circuit includes:

a fourth transistor having a gate connected to a reference voltage source and a drain connected to a second current source;

a fifth transistor having a gate connected to said negative output port and a drain connected to said second current source;

a sixth transistor having a gate connected to said reference voltage source and a drain connected to a third current source;

a seventh transistor having a gate connected to said positive output port and a drain connected to said third current source;

a eighth transistor having a gate connected to a source of said seventh transistor, a drain connected to a source of said seventh transistor, and a source connected to said negative power voltage source, and in which its gate and its drain are connected to each other;

a ninth transistor having a gate connected to said drain of said eighth transistor, a drain connected to a connection node connecting a source of said fourth transistor with a source of said sixth transistor, and a source connected to said negative power voltage source; and a tenth transistor having a gate connected to said connection node and a drain connected to a fourth current source.

4. A CMOS differential operational amplifier as claimed in claim 2, wherein said common-mode feedback circuit includes:

a fourth transistor having a gate connected to a reference voltage source and a drain connected to a second current source;

a fifth transistor having a gate connected to said negative output port and a drain connected to said second current source;

a sixth transistor having a gate connected to said reference voltage source and a drain connected to a third current source;

a seventh transistor having a gate connected to said positive output port and a drain connected to said third current source;

a eighth transistor having a gate connected to a source of said seventh transistor, a drain connected to a source of said seventh transistor, and a source connected to said negative power voltage source, and in which its gate and its drain are connected to each other;

a ninth transistor having a gate connected to said drain of said eighth transistor, a drain connected to a connection node connecting a source of said fourth transistor with a source of said sixth transistor, and a source connected to said negative power voltage source; and a tenth transistor having a gate connected to said connection node and a drain connected to a fourth current source.

* * * * *

UNITED STATES PATENT AND TRADEMARK OFFICE
CERTIFICATE OF CORRECTION

PATENT NO. : 5,578,964
DATED : November 26, 1996
INVENTOR(S) : Kim, et. al.

It is certified that error appears in the above-indentified patent and that said Letters Patent is hereby corrected as shown below:

Title page, item [22], change "April 24, 1995" to --April 25, 1995--.
In column 1, line 1, change "CM OS" to --CMOS--.

In column 1, line 41, delete "," after "circuit".

In column 1, line 42, delete "," after "stage".

Signed and Sealed this

Eighth Day of April, 1997

Attest:

BRUCE LEHMAN

*Attesting Officer*  Commissioner of Patents and Trademarks